United States Patent [19]

Kuki

[11] Patent Number: 4,502,141
[45] Date of Patent: Feb. 26, 1985

[54] CIRCUIT FOR CHECKING BIT ERRORS IN A RECEIVED BCH CODE SUCCESSION BY THE USE OF PRIMITIVE AND NON-PRIMITIVE POLYNOMIALS

[75] Inventor: Takakuni Kuki, Tokyo, Japan

[73] Assignee: Nippon Electric Co., Ltd., Tokyo, Japan

[21] Appl. No.: 415,873

[22] Filed: Sep. 8, 1982

[30] Foreign Application Priority Data

Sep. 11, 1981 [JP] Japan ............................ 56-144526

[51] Int. Cl.³ .......................................... G06F 11/10
[52] U.S. Cl. .................................................. 371/37
[58] Field of Search .......................... 371/37, 39, 40

[56] References Cited

U.S. PATENT DOCUMENTS

| 3,213,426 | 10/1965 | Melas ................................... 371/37 |
| 3,771,126 | 11/1973 | Apple, Jr. ............................ 371/37 |
| 4,330,860 | 5/1982 | Wada et al. ......................... 371/37 |
| 4,397,022 | 8/1983 | Weng et al. ........................ 371/37 |

*Primary Examiner*—Charles E. Atkinson
*Attorney, Agent, or Firm*—Sughrue, Mion, Zinn, Macpeak & Seas

[57] ABSTRACT

For use in deciding whether a single or a t-tuple error (t being greater than unity) is present in each bit sequence given as a primitive BCH code in accordance with a generator polynomial comprising a primitive and a non-primitive polynomial, an error checking circuit comprises first and second dividers (16, 17) for dividing each bit sequence by the primitive and the non-primitive polynomials to provide first and second signals, respectively. If the bit sequence includes only a single error, the first signal represents one of non-zero residues which result by the division when such single errors are present at the respective bit locations of the sequence. A memory (18) is preliminarily loaded with reference numbers corresponding to the respective non-zero residues and produces one of the reference numbers in response to the first signal only in the presence of a single error. A comparator (19) compares the produced reference number with a residue represented by the second signal to carry out the decision. Preferably, the memory is loaded also with the single error bit locations to locate the single error in a bit sequence being checked. The circuit may be a microcomputer operable in the above-described manner.

3 Claims, 4 Drawing Figures

CIRCUIT FOR CHECKING BIT ERRORS IN A RECEIVED BCH CODE SUCCESSION BY THE USE OF PRIMITIVE AND NON-PRIMITIVE POLYNOMIALS

BACKGROUND OF THE INVENTION

This invention relates to an error checking circuit for use at a receiving end of a digital communication system, such as a land mobile telephone communication system.

With a digital communication system, an error correcting code is indispensable because the system makes use of a transmission line, such as a radio channel, having a high bit error rate. As the error correcting code, a Bose-Chaudhuri-Hocquenghem (abbreviated to BCH) code is well known as a sort of cyclic codes in the art. It is already known that the BCH codes are classified into primitive and non-primitive BCH codes. A BCH code having a minimum intercode distance which is not less than four, has been used in the land mobile telephone communication system to transmit various kinds of control signals between a base station located at a preselected site and substations, such as automobiles. It is also known that use of a cyclic code of a greater minimum intercode distance enables not only correction of a single error but also correction of a t-tuple error, such as a double error, a triple error, or the like, t being representative of an integer greater than unity.

It is a recent trend that the single error alone is corrected while the t-tuple error is merely detected without correction, even when the BCH code is such that the correction of double errors is possible. This is because the triple error is often wrongly corrected as the double error despite the fact that the triple error actually occurs.

A conventional error checking circuit is operated in response to an input succession of bit sequences, each forming a preselected one of the primitive and the non-primitive BCH code, and comprises a divider for dividing each bit sequence by a generator polynomial for the preselected BCH code to watch a syndrome dependent on errors and a circuit for determining an error location in each bit sequence in accordance with the syndrome when the syndrome exhibits occurrence of the single error. The single error is corrected in each bit sequence with reference to the error location.

The conventional error checking circuit comprises a read-only memory (abbreviated to an ROM) as the circuit for determining the error location in each bit sequence. Such an ROM is programmed in advance to produce an error location signal representative of the error location, in response to the syndrome. With the conventional error checking circuit, the ROM must have a great memory bit capacity in order to carry out the above-mentioned operation, as will later be described with reference to one of a few figures of the accompanying drawing. Accordingly, the conventional error checking circuit is expensive.

SUMMARY OF THE INVENTION

It is an object of this invention to provide an error checking circuit which is inexpensive as compared with a conventional error checking circuit.

An error checking circuit to which this invention is applicable is responsive to an input succession of bit sequences for checking bit errors in the input succession by deciding whether each bit sequence includes a single error or a t-tuple error where t represents an integer which is greater than unity. The single error may appear at a bit location in each bit sequence. Each of the bit sequences is determined by a combination of a predetermined number of information bits and a preselected number of check bits generated by a predetermined generator polynomial to ensure a minimum intercode distance which is not less than four. The predetermined generator polynomial is equal to a product of factors comprising a primitive and a non-primitive polynomial. According to this invention, the error checking circuit comprises first dividing means for successively dividing the individual bit sequences by the primitive polynomial to calculate first residues, respectively, and to produce first residue signals representative of the respective first residues. The first residues calculated when the single errors are present in the bit sequences divided by the primitive polynomial, respectively, become first non-zero residues, respectively. The first non-zero residues are unique with respect to the bit locations at which the last-mentioned single errors are present, respectively. The circuit comprises second dividing means for successively dividing the individual bit sequences by the non-primitive polynomial to calculate second residues, respectively, and to produce second residue signals representative of the respective second residues. The second residues calculated in whichever of a first case where the bit sequences divided by the non-primitive polynomial include the single errors, respectively, and a second case where the bit sequences divided by the non-primitive polynomial include the t-tuple errors, respectively, become second special residues, respectively. The circuit further comprises memorizing means for memorizing a plurality of reference signals representative of reference numbers, respectively. The reference numbers are in one-to-one correspondence to the first non-zero residues and are identical with those of the second special residues which would be calculated by the second dividing means only in the first case and accessing means responsive to the first residue signals for accessing the memorizing means to make the memorizing means produce the reference signals as output reference signals, respectively, when the first residue signals responsive to which the memorizing means is accessed represent the first non-zero residues, respectively. The output reference signal produced when the first residue signal responsive to which the memorizing means is accessed represents one of said first non-zero residues is representative of the reference number which is in one-to-one correspondence to the one of the first non-zero residues. The circuit comprises comparing means for comparing the second residue signal produced when each bit sequence is divided by the non-primitive polynomial with the output reference signal produced in response to the first residue signal produced when the last-mentioned bit sequence is divided by the primitive polynomial. The comparing means thereby produces a result signal representative of presence of a single and a t-tuple error in the last-mentioned bit sequence when the reference number represented by the last-mentioned output reference signal is in one-to-one correspondence to the first non-zero residue represented by the last-mentioned first residue signal and is not, respectively.

DESCRIPTION OF THE PREFERRED EMBODIMENTS

(1) Prior Art

Figure 1:
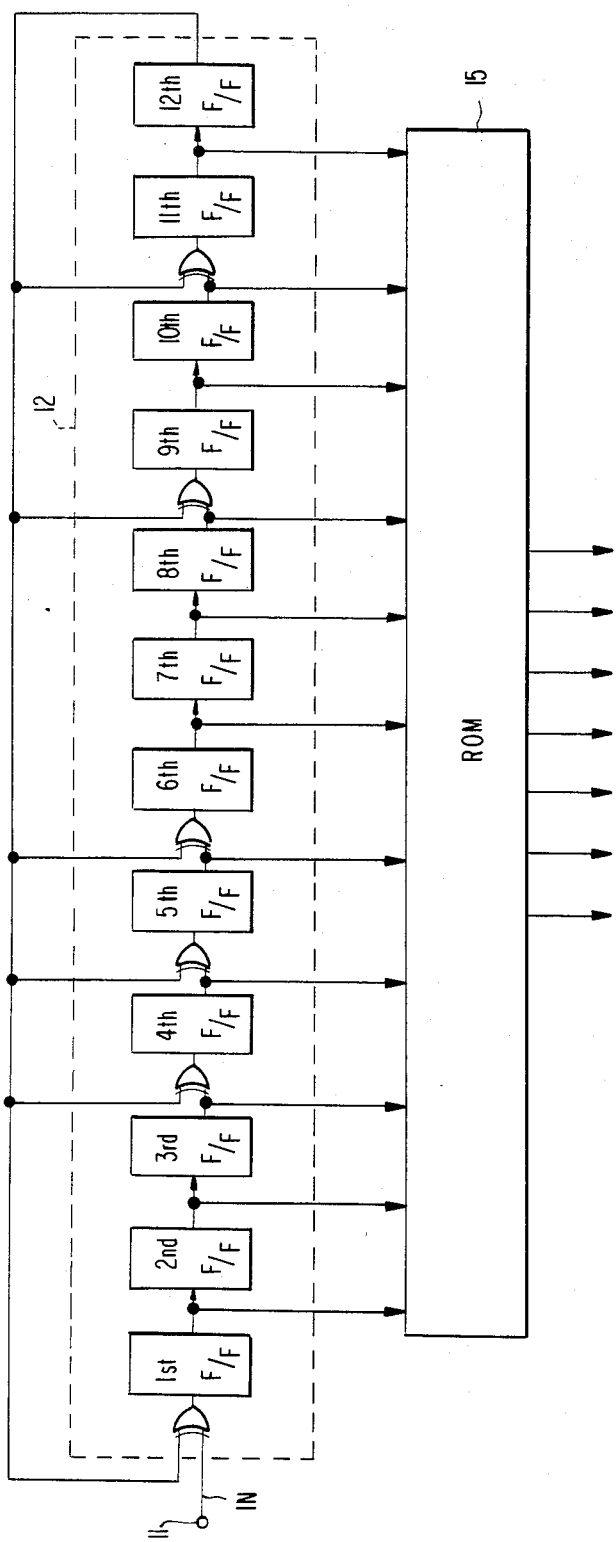
FIG. 1 is a block diagram of a conventional error checking circuit.

Referring to FIG. 1, a conventional error checking circuit will be described at first for a better understanding of this invention. It is assumed that the error checking circuit has a circuit input terminal 11 supplied with an input succession IN of bit sequences each of which is a primitive BCH code of (63, 51), where the first number "63" in the parentheses represents a code length of each bit sequence and the second number "51," the number of information bits in each bit sequence. A difference between the code length and the number of the information bits is equal to the number of check bits which are usually placed immediately after each train of the information bits. Consequently, each of the bit sequences include twelve check bits. Thus, the BCH code is a combination of the information and the check bits. As known in the art, the above-mentioned BCH code has a minimum intercode distance equal to five and is specified by a generator polynomial which is of twelve degrees and given by:

$$x^{12}+x^{10}+x^8+x^5+x^4+x^3+1. \quad (1)$$

In FIG. 1, the error checking circuit is for use in correcting single errors by checking bit locations of the single errors in the bit sequences, if the single errors are present in the bit sequences. On the other hand, t-tuple errors can merely be detected in the bit sequences without correction, where t represents an integer greater than unity, although correction of double errors is possible with the exemplified BCH code. More particularly, the double errors are not corrected in the bit sequences but processed like triple errors or so. The t-tuple errors are dealt with as though it were impossible to correct them. Namely, the error checking circuit produces signals representative of impossibility of correction when the t-tuple errors appear in the bit sequences. Error-free signals are produced from the error checking circuit when no error is detected in the bit sequences.

Such correction and detection can be accomplished by monitoring residues obtained by dividing the individual bit sequences by the generator polynomial (1). For this purpose, the error checking circuit comprises a divider 12 operated as a feedback register and comprising first through twelfth flip-flops and first through sixth Exclusive OR's, namely, adders (mod 2), interposed between the twelfth and the first, the third and the fourth, the fourth and the fifth, the fifth and the sixth, the eighth and the ninth, and the tenth and the eleventh flip-flops in accordance with the generator polynomial (1). The first Exclusive OR is supplied with the input succession IN. The second through the sixth Exclusive OR's are supplied with a flip-flop output signal produced by the twelfth flip-flop. It is to be noted here that the number of the flip flops is equal to that of the check bits following the information bits.

Let one of the bit sequences be considered for simplicity of description. The illustrated divider can divide the bit sequence in question by the generator polynomial (1) to produce, in a bit parallel fashion, a parallel output signal of twelve bits representative of a residue resulting from the division. The residue becomes a zero residue when the bit sequence is divisible by the generator polynomial (1). The zero residue is representative of an error-free state of the bit sequence. Otherwise, the residue becomes a non-zero residue. A pattern of the non-zero residue specifies a syndrome of the error in the bit sequence and may, therefore, be called a syndrome. As to the input succession IN including a plurality of the bit sequences, various kinds of syndromes appear as residues from the first through the twelfth flip-flops, depending on the errors, when the input succession is successively divided by the generator polynomial (1).

When the BCH code has the code length of sixty-three, a single error appears at any one of first through sixty-third bit locations. All syndromes relating to the single errors can be expressed by a combination of six bits and may be called single error syndromes.

On occurrence of the t-tuple errors, such as the double and the triple errors, the impossibility of correction should be indicated as described before. In addition, the error-free signal should be produced when the zero residue appears from the divider 12.

To this end, the checking circuit comprises an ROM 15 supplied with the each parallel output signal of twelve bits from the divider 12 after reception of sixty-three bits of each bit sequence. In order to respond to the output signals, the ROM 15 has $2^{12}$ addresses. It is necessary for the ROM 15 to produce sixty-five kinds of signals representative of the single errors, the impossibility of correction, and the zero residue. Each address of the ROM 15 should, therefore, have a bit capacity of seven bits. This means that the ROM 15 should have a total bit capacity of $7\times 2^{12}$ bits (=28,672 bits). Thus, the illustrated checking circuit is disadvantageous in that the ROM 15 must have a terribly large bit capacity and is therefore expensive, as pointed out in the preamble of the instant specification.

(2) Principle of the Invention

The principle of the invention will be described on the assumption that use is made of the generator polynomial expressed by the formula (1) and of the primitive BCH code. Inasmuch as it is known in the art that such a BCH code is a kind of a cyclic code and that the generator polynomial (1) of twelve degrees has a period equal to sixty-three, the generator polynomial (1) has to be a factor of the following equation.

$$x^{63}-1=0. \quad (2)$$

In fact, it has been proved that Equation (2) is divisible by the generator polynomial (1), although the proof is omitted in the instant specification. Equation (2) has those roots of sixty-three which are represented by $\alpha^0$, $\alpha^1, \alpha^2, \ldots$, and $\alpha^{62}$. The root $\alpha^1$ is called a primitive root because $\alpha^0$ is equal to unity.

It is to be noted here that the generator polynomial (1) is divisible, namely, factorized into first and second partial polynomials $g_1(x)$ and $g_3(x)$ represented by:

$$g_1(x)=x^6+x+1 \quad (3)$$

and $$g_3(x) = x^6 + x^4 + x^2 + x + 1. \quad (4)$$

When $g_1(x) = 0$, the first partial polynomial $g_1(x)$ takes six of the above-mentioned sixty-three roots that are represented by $\alpha^1$, $\alpha^2$, $\alpha^4$, $\alpha^8$, $\alpha^{16}$, and $\alpha^{32}$. Likewise, the second partial polynomial $g_3(x)$ takes six roots represented by $\alpha^3$, $\alpha^6$, $\alpha^{12}$, $\alpha^{24}$, $\alpha^{48}$, and $\alpha^{96}$ when $g_3(x) = 0$. The last root $\alpha^{96}$ of the second partial polynomial $g_3(x)$ is equal to $\alpha^{33}$. The suffixes "1" and "3" of the first and the second partial polynomials $g_1(x)$ and $g_3(x)$ are made to correspond in accordance with the practice to the minimum powers of six roots of the first and the second partial polynomials $g_1(x)$ and $g_3(x)$, respectively.

The first partial polynomial $g_1(x)$, which has the root $\alpha^1$, namely, the primitive root, is called a primitive polynomial. The primitive polynomial is irreducible and has a period equal to $2^6 - 1$.

At any rate, when each of the bit sequences is divided by the primitive polynomial $g_1(x)$, a first residue is calculated by the division. The first residue can take a value peculiar to each of sixty-three kinds of the single errors and can, therefore, specify each single error on occurrence of the single error. Such a residue gives a non-zero residue. In addition, the first residue can also specify the error-free state when each of the bit sequences is divisible by the primitive polynomial (1) and gives a zero residue. The first residue is produced in a binary fashion of six parallel bits. When the above-mentioned divisions are successively carried out with respect to the individual bit sequences, a plurality of first residues are successively calculated.

It should be noted that, on occurrence of the t-tuple errors, the first residues often take the same values as the single errors. As a consequence, it is difficult to distinguish the single errors from the t-tuple errors only by the use of the primitive polynomial.

The second partial polynomial $g_3(x)$, which may be called a non-primitive polynomial, is used to distinguish the single errors from the t-tuple ones. More specifically, divisions of the bit sequences by the non-primitive polynomial result in second residues which take values different from the first residues. The second residues do not always take values different from one another on occurrence of the single errors. Stated otherwise, one of the second residues possibly takes the same value as the other one of the second residues when the single errors take place in the bit sequences.

It is assumed that a particular single error is present at a particular bit location in one of the bit sequences and that a first residue represents a value appearing on occurrence of the particular single error. Moreover, let the second residue represent another value appearing on occurrence of the particular single error. Thus, when both of the first and the second residues specify the particular single error present at the particular bit location, it has been confirmed that none of the doubles and the triple errors is present in the bit sequence in question. For example, when the first residue specifies a single error present at the sixth bit location of the bit sequence and the second residue concurrently specifies the single error in question, the double and the triple errors never appear in the bit sequence but the single error alone is present at the sixth bit location. Thus, if both of the first and the second residues concurrently specify a single error present at a certain one of the bit locations, it may be recognized that the single error occurs at the bit location in question.

(3) First Embodiment

Figure 2:
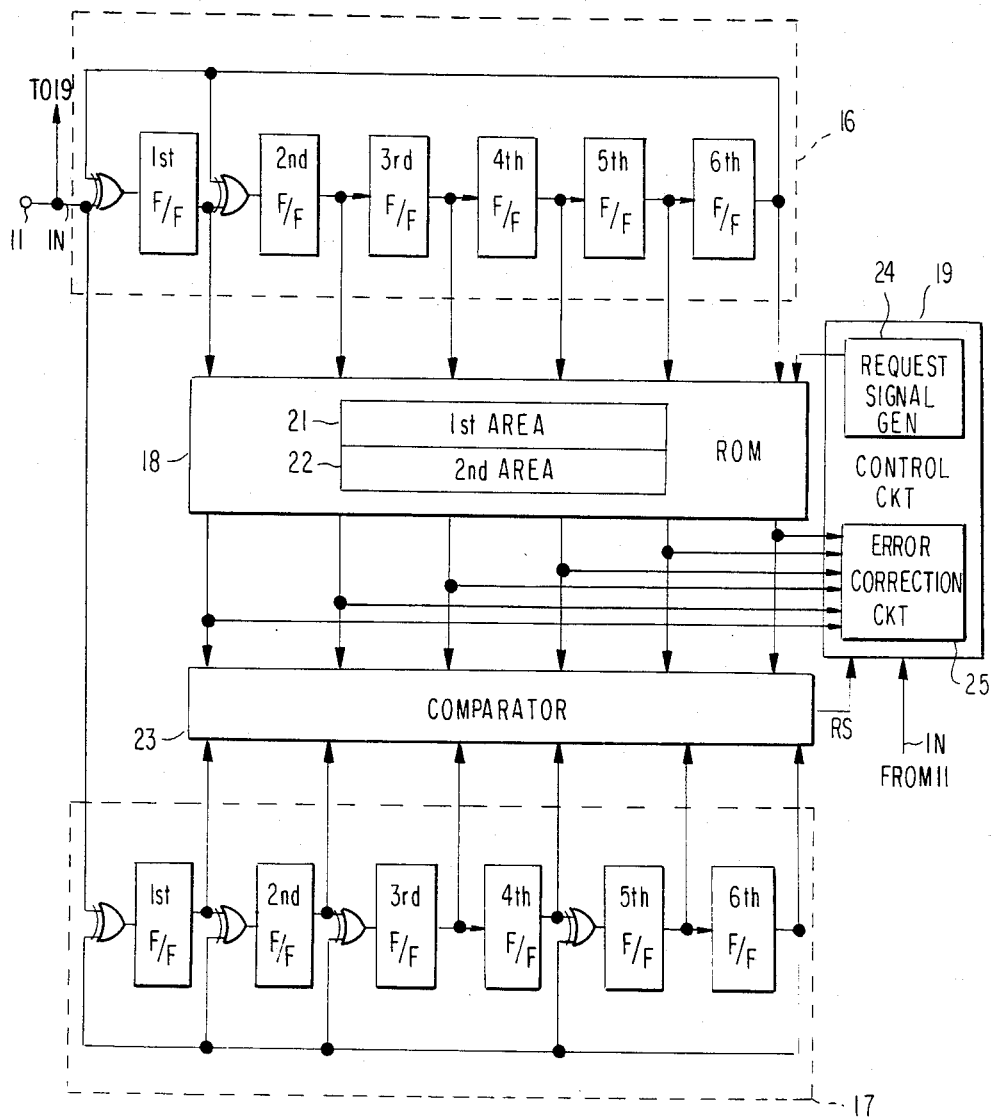
FIG. 2 is a block diagram of an error checking circuit according to a first embodiment of this invention.

Referring to FIG. 2, an error checking circuit according to a first embodiment of this invention is operable in response to an input succession IN of bit sequences to check bit errors in the respective bit sequences, as is the case with the error checking circuit illustrated with reference to FIG. 1. It will be presumed merely for simplicity of description that each of the bit sequences is similar to that described in conjunction with FIG. 1 and is therefore determined by fifty-one information bits and the generator polynomial (1). Under the circumstances, each of the bit sequences forms a primitive BCH code having the code length equal to 63 and the minimum intercode distance of 5.

In FIG. 2, the illustrated error checking circuit comprises first and second dividers 16 and 17 which individually and concurrently divide each bit sequence by the primitive and the non-primitive polynomials $g_1(x)$ and $g_3(x)$, respectively. The first divider 16 is constituted by a feedback register and comprises first through sixth flip-flops and first and second Exclusive OR gates interposed between the sixth and the first flip-flops and between the first and the second flip-flops. The first Exclusive OR gate is supplied with the input succession IN. The second Exclusive OR gate is supplied with a flip-flop output signal produced by the sixth flip-flop. Likewise, the second divider 17 is constituted by an additional feedback register and comprises first through sixth additional flip-flops and first through fourth additional Exclusive OR gates located between the sixth and the first additional flip-flops, between the first and the second additional flip-flops, between the second and the third additional flip-flops, and between the fourth and the fifth additional flip-flops, respectively. The first additional Exclusive OR gate is supplied with the input succession IN. The second through the fourth Exclusive OR gates are supplied with an additional flip-flop output signal produced by the sixth additional flip-flops. It is readily understood that, with the first and the second dividers 16 and 17, divisions of the bit sequences are carried out in accordance with the primitive and the non-primitive polynomials $g_1(x)$ and $g_3(x)$, respectively. Accordingly, description will be omitted about operation of the first and the second dividers 16 and 17 in the instant specification.

When each of the bit sequences is divided in the first divider 16 by the primitive polynomial $g_1(x)$, a first residue is kept in the first divider 16. The first residue is represented by six bits and is a zero or a non-zero residue as described before. Such non-zero residues are those of sixty-three first non-zero residues which are selected with repetition in accordance with the sixty-three bit locations where it is possible for the single errors to be present. Such non-zero residues also appear when the t-tuple errors are present in the bit sequences.

At any rate, the first divider 16 successively supplies an ROM 18 with first residue signals representative of the respective first residues in a bit parallel fashion.

Likewise, a second residue remains in the second divider 17 when each of the bit sequences is divided by the non-primitive polynomial $g_3(x)$. The second residue is represented by six bits, like the first zero or non-zero residue.

Such second residues in the second divider 17 become zero residues when the bit sequences are divisible by the second partial polynomial, namely, the non-primitive polynomial $g_3(x)$ and otherwise become second special residues including non-zero and zero residues. The second special residues appear either in a first case where the bit sequences include the single errors or a second case where the bit sequences include the t-tuple errors. As a result, the second divider 17 produces second residue signals representative of the second residues, respectively. The second special residues or non-zero residues appearing in the first case may be called second specific non-zero residues.

The ROM 18 is coupled to the first divider 16 and comprises first and second areas 21 and 22 each of which is accessed by an address signal of seven bits. The most significant bit of the address signal is delivered to the ROM 18 from a control circuit 19 which puts the ROM 18 into operation in first and second modes. The control circuit 19 produces a logic "0" and a logic "1" level. signal as the most significant bit of the address signal in a first and a second mode of accessing the first and the second areas 21 and 22, respectively. Each of the first residues is given to the ROM 18 as the less significant bits of the address signal. Thus, each of the first residue signals serves as a part of the address signal.

The first area 21 memorizes a plurality of reference signals representative of reference numbers, respectively. The reference numbers are in one-to-one correspondence to the first non-zero residues and are identical with those of the second special residues, namely, the second specific non-zero residues which would be calculated by the second feedback register 17 only in the first case, in the case where the single errors are included in the bit sequences. As a result, the number of the reference signals becomes equal to sixty-three.

The first area 21 is accessed in the first mode by the above-mentioned address signals including the first residue signals to produce the reference signals as output reference signals, respectively, when the first residue signals represent the first non-zero residues, respectively. A particular one of the output reference signals, which is produced when a particular one of the first residue signals represents one of the first non-zero residues, is representative of the reference number which is in one-to-one correspondence to the particular one of the first non-zero residues.

Thus, input and output connections of the ROM 18, which are connected to the first area 21, constitute an accessing circuit for accessing the first area 21.

A comparator 23 is coupled to the ROM 18 and the second divider 17 and compares a particular one of the second residue signals with the particular one of the output reference signal. The particular one of the second residue signals is produced when the bit sequence in question is divided by the second partial polynomial, namely, the non-primitive polynomial $g_3(x)$ while the particular one of the output reference signals is produced in response to the particular one of the first residue signals produced when the bit sequence in question is divided by the first partial polynomial, namely, the primitive polynomial $g_1(x)$. In any event, the comparator 23 produces a result signal RS representative of presence of a single and a t-tuple error in the bit sequence in question when the reference number represented by the particular output reference signal is in one-to-one correspondence to a particular one of the first non-zero residues represented by the particular one of the first residue signals and is not, respectively. The result signal RS takes a first and a second value when the single and the t-tuple errors are present in the bit sequences, respectively. The first and the second values may be given as the logic "0" and the logic "1" level signals, respectively. Thus, the comparator 23 produces the logic "0" and the logic "1" level signals as the result signal RS when the particular output reference signals is coincident and non-coincident with the particular one of the second residue signals. The result signals of the first and the second values may, therefore, be called a coincidence and a non-coincidence signal, respectively.

Responsive to the coincidence signal, the control circuit 19 supplies the ROM 18 with the logic "1" level signal from a request signal generator 24 thereof to make the ROM 18 operate in the second mode and to detect an error location in the bit sequence in question. The logic "1" level signal is given as the most significant bit of the address signal including the particular one of the first residue signals. Thus, the logic "1" level signal from the request signal generator 24 serves to request the ROM 18 to correct the single error in the bit sequence in question and is, therefore, called an error correction request signal.

The second area 22 stores error location signals specifying bit locations of the single errors of sixty-three kinds. Responsive to the address signal including the error correction request signal, the ROM 18 reads a particular one of the error location signals from the address specified by the received address signal. The particular error signal is sent to the control circuit 19.

Inasmuch as the control circuit 19 comprises an error correction circuit 25 supplied with the bit sequence in question, the error correction circuit 25 corrects the single error in the bit sequence in response to the error location signal. From this fact, it is readily understood that the second area 22 should store sixty-three kinds of the error location signals to specify the respective single errors. In addition, an additional signal is stored in the second area 22 to inform the control circuit 19 of no errors. Therefore, a total of the error location signals and the additional signal becomes equal in number to sixty-four. Inasmuch as two to the sixth power is equal to sixty-four, all of the output signals can be represented by six bits.

As a result, the total bit capacity of the ROM 18, which is equal to a sum of the bit capacities of the first and the second areas 21 and 22, is given by:

$$6 \text{ (bits)} \times 2^7 = 768 \text{ (bits)}. \tag{5}$$

The number of 768 (bits) is astonishingly smaller than the number described as 28,672 in conjunction with FIG. 1. With the circuit according to the first embodiment of this invention, it is posssible to use an ROM of a small bit capacity as compared with the conventional circuit illustrated in FIG. 1.

Responsive to the non-coincidence signal, the control circuit 19 informs a transmitting end (not shown) of impossibility of correction of the bit sequence in question. The transmitting end transmits the bit sequence in the bit sequence to the receiving end again, as known in the art.

(4) Second Embodiment

Figure 3:
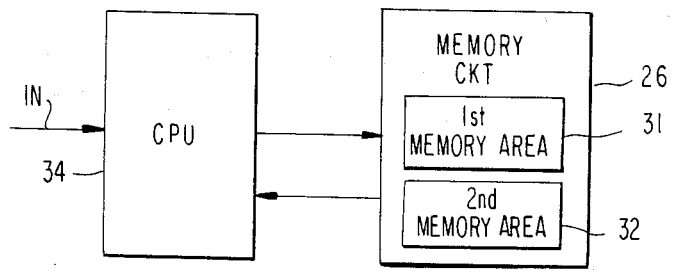
FIG. 3 is a block diagram of an error checking circuit according to a second embodiment of this invention.

Referring to FIG. 3, an error checking circuit according to a second embodiment of this invention comprises a microcomputer for carrying out operation similar to that illustrated with reference to FIG. 2. Like in FIG. 2, let first and second residues be calculated when the bit sequences are divided by the primitive and the non-primitive polynomials $g_1(x)$ and $g_3(x)$, respectively.

In particular, the first and the second residues are assumed to take first and second specific non-zero residues when the bit sequences include the single errors. The microcomputer comprises a memory circuit 26 comprising, in turn, first and second memory areas 31 and 32 similar to the first and the second areas 21 and 22 described in conjunction with FIG. 2. From this fact, it is readily understood that the first memory area 31 has a plurality of addresses to memorize in the respective addresses, the reference signals representative of the reference numbers identical with the second specific non-zero residues and that the second memory area 32 has a plurality of addresses to memorize, in the respective addresses, the error location signals representative of the bit locations at which the single errors are present in the bit sequences, as are the cases with the first and the second areas 21 and 22, respectively.

The microcomputer comprises a central processing unit 34 responsive to the input succession of the bit sequences for cooperating with the memory circuit 26.

Figure 4:
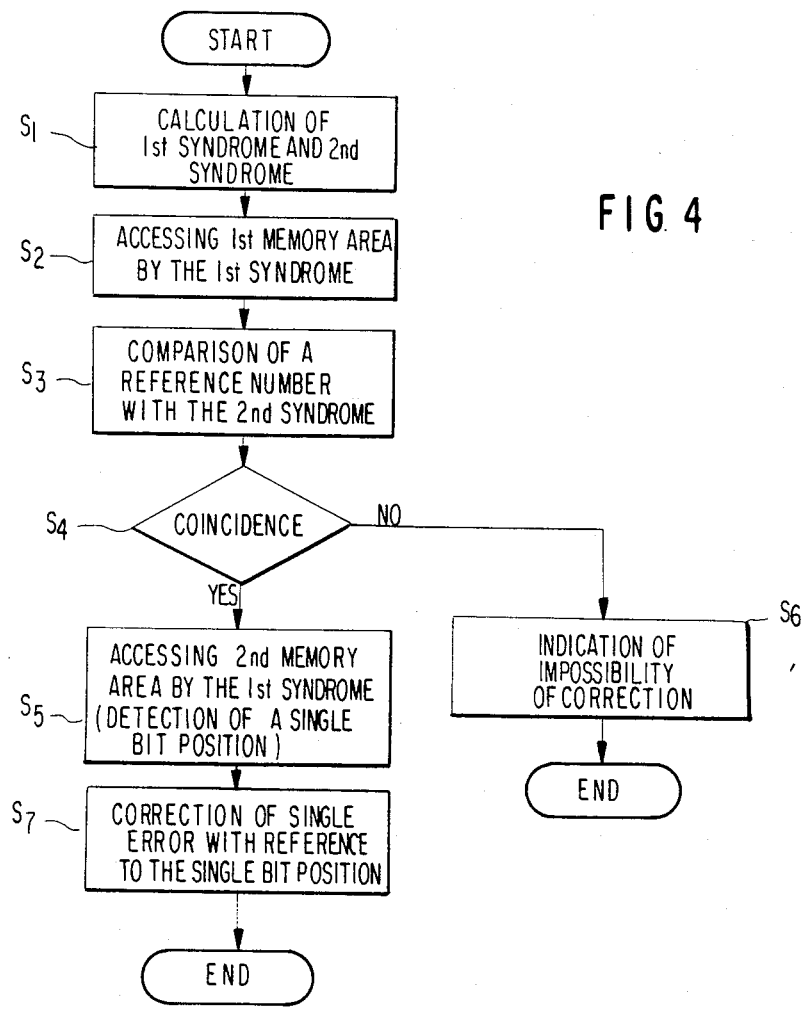
FIG. 4 is a flow chart for describing operation of the error checking circuit illustrated in FIG. 3.

Referring to FIG. 3 again and to FIG. 4 afresh, the central processing unit 34 processes the input succession IN to correct the single errors in the bit sequences when the single errors are present in the bit sequences. The central processing unit 34 indicates impossibility of correction when the t-tuple errors appear in the bit sequences. More particularly, the central processing unit 34 divides the bit sequences by the primitive polynomial $g_1(x)$ and the non-primitive polynomial $g_3(x)$ to calculate first and second results corresponding to the first residues and the second residues, respectively, as shown at the stage $S_1$ in FIG. 4. The first and the second results may be called first and second syndromes, respectively.

The central processing unit 34 accesses the first memory area 31 by the use of the first syndromes, as shown at the stage $S_2$. When the first syndromes specify the addresses of the first memory area 31, the reference signals are read out of the addresses indicated by the first syndromes. Subsequently, the reference signals are compared with the second syndromes at the stage $S_3$ to detect coincidence between the reference numbers and the second syndromes. When the coincidence is detected at the stage $S_4$, coincidence signals are produced to access the second memory area 32 by the first syndromes, as shown at the stage $S_5$, and, otherwise, impossibility of correction is indicated at the stage $S_6$.

Responsive to the first syndromes, the second memory area 32 produces the error location signals on production of the coincidence signals. The central processing unit 34 corrects the single errors appearing at those bit locations of the bit sequences which are specified by the error location signals, respectively, as shown at the stage $S_7$.

While this invention thus far been described in conjunction with a few embodiments thereof, it is readily possible for those skilled in the art to put this invention into practice in various other manners. For example, a non-primitive BCH code may also be used instead of the primitive BCH code. In addition, this invention is feasible even when divisions are carried out after the partial polynomials are multiplied by suitable factors or constants. This invention may be used to transmit an idle code signal, a paging code signal, a response signal, a channel code signal, and an identification code signal between a base station and substations when applied to the land mobile telephone communication system.

What is claimed is:

1. An error checking circuit responsive to an input succession of bit sequences for checking bit errors in said input succession by deciding whether each bit sequence includes a single error or a t-tuple error where t represents an integer which is greater than unity, said single error being present at a bit location in said each bit sequence, each of said bit sequences being determined by a combination of a predetermined number of information bits and a preselected number of check bits generated by a predetermined generator polynomial to ensure a minimum intercode distance which is not less than four, said predetermined generator polynomial being equal to a product of factors comprising a primitive and a non-primitive polynomial, said error checking circuit comprising:

first dividing means for successively dividing the individual bit sequences by said primitive polynomial to calculate first residues, respectively, and to produce first residue signals representative of the respective first residues, the first residues calculated when the single errors are present in the bit sequences divided by said primitive polynomial, respectively, becoming first non-zero residues, respectively, said first non-zero residues being unique with respect to the bit locations at which the last-mentioned single errors are present, respectively;

second dividing means for successively dividing the individual bit sequences by said non-primitive polynomial to calculate second residues, respectively, and to produce second residue signals representative of the respective second residues, the second residues calculated in whichever of a first case where the bit sequences divided by said non-primitive polynomial include the single errors, respectively, and a second case where the bit sequences divided by said non-primitive polynomial include the t-tuple errors, respectively, becoming second special residues, respectively;

memorizing means for memorizing a plurality of reference signals representative of reference numbers, respectively, said reference numbers being in one-to-one correspondence to said first non-zero residues and being identical with those of said second special residues which would be calculated by said second dividing means only in said first case;

accessing means responsive to said first residue signals for accessing said memorizing means to make said memorizing means produce said reference signals as output reference signals, respectively, when the first residue signals responsive to which said memorizing means is accessed represent said first non-zero residues, respectively, the output reference signal produced when the first residue signal responsive to which said memorizing means is accessed represents one of said first non-zero residues being representative of the reference number which is in one-to-one correspondence to said one of the first non-zero residues;

comparing means for comparing the second residue signal produced when each bit sequence is divided by said non-primitive polynomial with the output reference signal produced in response to the first residue signal produced when the last-mentioned bit sequence is divided by said primitive polynomial, said comparing means thereby producing a result signal representative of presence of a single and a t-tuple error in the last-mentioned bit sequence when the reference number represented by the last-mentioned output reference signal is in one-to-one correspondence to the first non-zero residue represented by the last-mentioned first residue signal and is not, respectively.

2. An error checking circuit as claimed in claim 1, said circuit being for correcting the single errors in said input succession, the result signal taking a first and a second value indicative of presence of a single and a t-tuple error, respectively, said error checking circuit further comprising:

request signal producing means responsive to the result signal of said first value for producing an error correction request signal which is for requesting correction of the single error indicated by said first value;

additional memorizing means for memorizing a plurality of error location signals representative of the bit locations at which the single errors may be present;

additional accessing means responsive to a combination of said error correction request signal and the first residue signal responsive to which said error correction request signal is produced, for accessing said additional memorizing means to make said additional memorizing means produce a preselected one of said error location signals that is accessed in response to said combination; and means responsive to said preselected error location signal and the bit sequence responsive to which the result signal of said first value is produced, for correcting the single error indicated by said first value.

3. An error checking circuit responsive to an input succession of bit sequences for checking bit errors in said input succession by deciding whether each bit sequence includes a single error or a t-tuple error where t represents an integer which is greater than unity, said single error appearing at a bit location in said each bit sequence, each of said bit sequences being determined by a combination of a predetermined number of information bits and a preselected number of check bits generated by a predetermined generator polynomial to ensure a minimum intercode distance which is not less than four, said predetermined generator polynomial being equal to a product of factors comprising a primitive and a non-primitive polynomial, said primitive and said non-primitive polynomials bringing about first and second residues when the bit sequences are divided by said primitive and said non-primitive polynomials, respectively, said first and said second residues being first and second specific non-zero residues, respectively, when the bit sequences include the single errors, said error checking circuit comprising:

first memorizing means having a plurality of first addresses for memorizing, in the respective first addresses, reference signals representative of reference numbers, said reference numbers being identical with said second specific non-zero residues;

second memorizing means having a plurality of second addresses for memorizing, in the respective second addresses, error location signals representative of the bit locations at which the single errors are to appear in the individual bit sequences; and processing means responsive to said input succession and coupled to said first and said second memorizing means for processing said input succession to carry out error correction with reference to said reference signals and said error location signals only when the bit sequences include the single errors and to indicate impossibility of the error correction with reference to said reference signals when the bit sequences include the t-tuple errors.

* * * * *

UNITED STATES PATENT AND TRADEMARK OFFICE
CERTIFICATE OF CORRECTION

PATENT NO. : 4,502,141

DATED : February 26, 1985

INVENTOR(S) : Takakuni KUKI

It is certified that error appears in the above-identified patent and that said Letters Patent is hereby corrected as shown below:

Column 5, line 59, "doubles" should be --double--.

Column 7, line 18, delete the period after "level";

line 31, insert --namely,-- after "case,".

Column 9, line 55, insert --has-- after "invention".

Signed and Sealed this

Eighth Day of October 1985

[SEAL]

Attest:

DONALD J. QUIGG

Attesting Officer

Commissioner of Patents and
Trademarks—Designate